United States Patent
Pradhan et al.

(10) Patent No.: US 11,670,727 B2
(45) Date of Patent: Jun. 6, 2023

(54) SOLAR ELECTRICITY GENERATION SYSTEM AND METHOD

(71) Applicant: Sri Satya Acqusitions LLC, Chicago, IL (US)

(72) Inventors: Thomas Nicodemus Pradhan, Hyderabad (IN); Satyanarayana Venkata Nootigattu, Hyderabad (IN); Srinivas Paspulla, Chicago, IL (US)

(73) Assignee: Sri Satya Acquisitions LLC, Chicago, IL (US)

( * ) Notice: Subject to any disclaimer, the term of this patent is extended or adjusted under 35 U.S.C. 154(b) by 0 days.

(21) Appl. No.: 17/186,337

(22) Filed: Feb. 26, 2021

(65) Prior Publication Data

US 2021/0296521 A1    Sep. 23, 2021

(51) Int. Cl.
*H01L 31/0525* (2014.01)
*H01L 31/0725* (2012.01)
*H01L 25/16* (2023.01)
*H02S 50/10* (2014.01)

(52) U.S. Cl.
CPC ........ *H01L 31/0525* (2013.01); *H01L 25/167* (2013.01); *H01L 31/0725* (2013.01); *H02S 50/10* (2014.12); *H10N 10/10* (2023.02)

(58) Field of Classification Search
CPC ............... H01L 31/0525; H01L 25/167; H01L 31/0725; H01L 35/28; H01L 31/035272; H01L 31/042; H01L 31/0547; H02S 50/10; H02S 40/22; H02S 50/00; Y02E 10/50

See application file for complete search history.

(56) References Cited

U.S. PATENT DOCUMENTS

| | | | |
|---|---|---|---|
| 3,232,795 A | 2/1966 | Gillette et al. | |
| 2012/0266938 A1* | 10/2012 | Goei | F24S 40/55 136/246 |
| 2014/0020752 A1* | 1/2014 | Arimoto | H01L 31/0747 438/96 |
| 2016/0190371 A1* | 6/2016 | Sorloaica-Hickman | H01L 31/048 136/246 |
| 2019/0253022 A1 | 8/2019 | Hadar et al. | |

(Continued)

FOREIGN PATENT DOCUMENTS

EP    3095139    7/2015
JP    H0621490 A  *  1/1994

OTHER PUBLICATIONS

Antonio Marti "Operation of the Three Terminal Heterojunction Bipolar Transistor Solar Cell" Phys. Status Solidi C 2017, 14, 1700191 (Year: 2017).*

(Continued)

*Primary Examiner* — Michael Y Sun
(74) *Attorney, Agent, or Firm* — Nyman IP LLC; Scott Nyman

(57) ABSTRACT

A solar electricity generation system is provided for generating electrical current from an improved solar system. The solar electricity generation system may include semiconductor layers, a thermoelectric component, angular configuration, and a monitoring component. A bias current may be applied to amplify the electrical power generated by the semiconductor layers. A method for generating electrical current from an improved solar system using the solar electricity generation system is also provided.

18 Claims, 5 Drawing Sheets

(56) References Cited

U.S. PATENT DOCUMENTS

2021/0075219 A1* 3/2021 Krasikov ............... H02S 50/10

OTHER PUBLICATIONS

Marti et al., Operation of the three terminal heterojunction bipolar transistor solar cell, paper, 4 pages, Instituto de Energia Solar, Universidad Politecnica de Madrid, Escuela Tecnica Superior de Ingenieros de Telecomunicacin, Madrid, Spian.

Tockhorn et al., Three-Terminal Perovskite/Silicon Tandem Solar Cells with Top and Interdigitated Rear Contacts, paper, 16 pages, HTW Berlin, University of Applied Sciences, Berlin, Germany.

Marti et al., The three terminal heterojunction bipolar transistor solar cell: a novel structure for multi-junction solar cells, paper, 2 pages, Institute de Energfa Solar—Universidad Politecnica de Madrid ETSI Telecomunicacion, Ciudad Universitaria, Madrid, Spain.

Linares et al., Novel heterojunction bipolar transistor architectures for the practical implementation of high-efficiency three-terminal solar cells, paper, Jan. 27, 2019, 24 pages, vol. 194, Instituto de Energfa Solar, Madrid, Spain.

Djebbour et al., Bandgap engineered smart three-terminal solar cell: New perspectives towards very high efficiencies in the silicon world, research article, Jan. 14, 2019, 19 pages, vol. 27, Issue 4, Progress In Photovoltaics.

Wang et al. ,Three terminal Si-Si:Ge solar cells, conference paper, Jun. 2011, 5 pages, IEEE, Seattle, WA.

Warren et al., Modeling Three-Terminal III-V/Si Tandem Solar Cells, conference paper, Jun. 25, 2017, 5 pages, IEEE, Washington, DC.

Marti et al., Three-terminal heterojunction bipolar transistor solar cell for high-efficiency photovoltaic conversion, article, Apr. 22, 2015, 6 pages, nature communications, Madrid, Spain.

Warren et al., Operating principles of three-terminal solar cells, conference paper, Jun. 10-15, 2018, 3 pages, IEEE, Waikoloa, HI.

National Aeronautics and Space Administration, High-Efficiency Solar Cell, online article, 2 pages, National Aeronautics and Space Administration.

* cited by examiner

SOLAR ELECTRICITY GENERATION SYSTEM AND METHOD

FIELD OF THE INVENTION

The present disclosure relates to a solar electricity generation system. More particularly, the disclosure relates to generating electrical current from an improved solar system.

BACKGROUND

As our global climate continues to change, research and development has accelerated in clean energy technologies. Cleaner power generation is replacing older pollution-causing technologies such as those reliant on combusting fossil fuels. Newer technologies based on wind and solar power generation are increasing in prevalence, but issues such as limited efficiency still need to be solved before widescale adoption can be achieved.

To these ends, researchers have been looking for ways to improve the efficiency and cost-effectiveness of solar cells. A solar photovoltaic (PV) array can include hundreds of solar cells, each of which can contribute to converting the radiation of the sun into electricity. The average efficiency is about 15%, which means nearly 85% of the sun's radiation is not being converted into electricity. Additionally, challenges relating to cooling solar panels can further limit the efficiency of a PV array.

Challenges not yet solved by the current state of the art include the capturing of more light by an area and converting a larger portion of the captured light into electricity. Standard solar cells are not believed to be able to meet these challenges, generally being configured as PN junctions. Their function is passive in nature for liberating electrons from the atoms to cross the junction and reach the bottom N-layer, further flowing through the bottom electrode plate to generate electric current. A single cell under the current state of the art can produce only very tiny amounts of electricity. A solar module must include a substantial number of interconnected solar cells to generate a sufficient amount of energy to charge a battery or be used directly to run electrical equipment.

Various attempts have been made in an effort to provide improved solar electricity generation, such as provided in the examples identified below. However, the example attempted solutions discussed below lack the useful and novel features of the present disclosure, which will be made clearer throughout this disclosure.

European publication EP 3,095,139 to Heng, et al. discloses an approach to design and fabrication a high-efficiency solar panel, including parallel coupling of solar panel cells, but fail to disclose aspects of the instant disclosure including semiconductor configuration and recovery of energy via a thermoelectric component. U.S. Pat. No. 3,232,795 to Gillette et al. discloses solar cell arrangements for outer space vehicles and the like but fails to disclose aspects of the instant disclosure including semiconductor configuration and recovery of energy via a thermoelectric component.

Non-patent literature titled "Operation of the three terminal heterojunction bipolar transistor solar cell" to Marti et al. discloses generally three terminal heterojunction bipolar transistor solar cells ("3T-HBTSC") and barriers in the prior art to be overcome, such as by useful and novel solutions presented in the instant disclosure including semiconductor configuration and recovery of energy via a thermoelectric component. Non-patent literature titled "Novel heterojunction bipolar transistor architectures for the practical implementation of high-efficiency three-terminal solar cells" to Linares et al. discloses proposed architecture types for 3T-HBTSCs but fails to disclose aspects of the instant disclosure including semiconductor configuration and recovery of energy via a thermoelectric component.

Non-patent literature titled "Three-Terminal Perovskite/Silicon Tandem Solar Cells with Top and Interdigitated Rear Contacts" to Tockhorn et al. discloses research regarding multi-layered perovskite cells for solar application but fails to disclose aspects of the instant disclosure including semiconductor configuration and recovery of energy via a thermoelectric component. Non-patent literature titled "The three terminal heterojunction bipolar transistor solar cell: a novel structure for multi-junction solar cells" to Marti et al. discloses research regarding use of NPN or PNP transistor structures as building blocks for solar cells but fails to disclose aspects of the instant disclosure including novel semiconductor configurations and recovery of energy via a thermoelectric component. Additional references exist which help to establish the current state of the art relating to this disclosure, all of which that are known are disclosed in a corresponding Information Disclosure Statement accompanying the instant application.

Therefore, a need exists to solve the deficiencies present in the prior art. What is needed is an improved solar electricity generation system. What is needed is an improved solar electricity generation system with multiple layers comprising P-type and N-type semiconductor materials. What is needed is grated silicon photovoltaic cells to increase the surface area for the incident of light within the same silicon photovoltaic cell dimension. What is needed is an improved solar electricity generation system configured as an amplifier circuit to improve efficacy. What is needed is an improved solar electricity generation system comprising a thermoelectric component to recover electrical current from heat. What is needed is a method for operating an improved solar electricity generation system to generate electrical power with high efficacy.

SUMMARY

An aspect of the disclosure advantageously provides an improved solar electricity generation system. An aspect of the disclosure advantageously provides an improved solar electricity generation system with multiple layers comprising P-type and N-type semiconductor materials. An aspect of the disclosure advantageously provides grated silicon photovoltaic cells to increase the surface area for the incident of light within the same silicon photovoltaic cell dimension. An aspect of the disclosure advantageously provides an improved solar electricity generation system configured as an amplifier circuit to improve efficacy. An aspect of the disclosure advantageously provides an improved solar electricity generation system comprising a thermoelectric component to recover electrical current from heat. An aspect of the disclosure advantageously provides a method for operating an improved solar electricity generation system to generate electrical power with high efficacy.

A system and method enabled by this disclosure may advantageously utilize the large amount of photonic flow that is not being presently used to liberate the electrons by intelligent and efficient construction of a novel solar power generation system. A system and method enabled by this disclosure may advantageously utilize the large amount of photonic flow due to the grated solar cell. By increasing the quantity of liberated electrons from the top collection layer to the bottom layer using external bias currents, which may be derived from the heat generated by the infrared frequencies from solar radiation, such as via a thermoelectric component.

Additionally, by including a thermoelectric component to convert at least part of the thermal energy from the semiconductor layers, a system enabled by this disclosure may advantageously reduce or eliminate heat mitigation requirements, such as would be required by inclusion of heat sinks and liquid cooling systems in large solar panel arrays to counter the heat generated during operation.

In additional embodiments enabled by this disclosure, solar panel systems may be provided with an increased spread area and increased range for angle of incidence of received solar rays and light, which may reduce or eliminate requirements for a tracking mechanism for common applications with grated surface. Additionally, otherwise wasted unconverted heat energy may be efficiently utilized, as the flow of electrons may be controlled using the converted thermal energy. In at least one embodiment, a system enabled by this disclosure may include an arrangement of semiconductor layers such to operate like an amplifier, for example, in a double junction transistor configuration.

In one embodiment, a monitoring component may be included to monitor and/or control aspects of a system enabled by this disclosure. For example, a location sensor may track an installation location and/or a communication component may communicate data relating to performance and to facilitate maintenance operations, even from remote areas.

Accordingly, the disclosure may feature an improved solar electricity generation system including semiconductor layers and a thermoelectric component. The semiconductor layers may convert photons from light into electrical current. The semiconductor layers may include a first semiconductor layer, a second semiconductor layer, and a third semiconductor layer. A first depletion zone may be located between the first semiconductor layer and the second semiconductor layer that upon receiving at least part of the photons generates the electrical current in a first current direction. A second depletion zone may be located between the second semiconductor layer and the third semiconductor layer that upon receiving at least part of the photons generates the electrical current in a second current direction. The thermoelectric component may be operatively installed to the third semiconductor layer to convert thermal energy received from the semiconductor layers into recovered electrical current. The thermoelectric component may be operatively installed to the semiconductor layers to convert thermal energy received from the semiconductor layers into recovered electrical current.

In another aspect, the semiconductor layers may alternate between a P-type material and an N-type material.

In another aspect, the first semiconductor layer may include the P-type material. In another aspect, the second semiconductor layer may include the N-type material. The third semiconductor layer may include the P-type material.

In another aspect, the semiconductor layers may be configured as a transistor.

In another aspect, the transistor may include an emitter provided by the first semiconductor layer, a base provided by the second semiconductor layer, and a collector provided by the third semiconductor layer. The transistor may be configured as an amplifier circuit. Upon the second semiconductor layer receiving a bias current, the electrical current flowing from the first semiconductor layer to the third semiconductor layer may be amplified.

In another aspect, the bias current may include the recovered electrical current.

In another aspect, the transistor may be a double junction transistor configured as an amplifier circuit.

In another aspect, the thermoelectric component may include a Peltier chip.

In another aspect, the semiconductor layers may be arranged to include a first angular-oriented portion to receive the photons from a first light angle of incidence and a second angular-oriented portion to receive the photons from a second light angle of incidence.

In another aspect, the semiconductor layers may alternate between the first angular-oriented portion and the second angular-oriented portion.

In another aspect, a monitoring component may be included having an operational sensor to detect a condition relating to operation of the solar electricity generation system, a geolocation sensor to approximate an installation location, and/or a communication module to communicate data between the monitoring component and an external device. The condition may be remotely monitored via the monitoring component.

According to an embodiment of this disclosure, an improved solar electricity generation system may be provided including semiconductor layers and novel angular orientations. The semiconductor layers may alternate between a P-type material and an N-type material to convert photons from light into electrical current. The semiconductor layers may include a first semiconductor layer comprising the P-type material, a second semiconductor layer comprising the N-type material, and a third semiconductor layer comprising the P-type material. A first depletion zone may be located between the first semiconductor layer and the second semiconductor layer that upon receiving at least part of the photons generates the electrical current in a first current direction. A second depletion zone may be located between the second semiconductor layer and the third semiconductor layer that upon receiving at least part of the photons generates the electrical current in a second current direction. The semiconductor layers may be arranged having a first angular-oriented portion to receive the photons from a first light angle of incidence and a second angular-oriented portion to receive the photons from a second light angle of incidence.

In another aspect, the semiconductor layers may be configured as a transistor comprising an emitter provided by the first semiconductor layer, a base provided by the second semiconductor layer, and a collector provided by the third semiconductor layer. The transistor may be configured as an amplifier circuit. Upon the second semiconductor layer receiving a bias current, the electrical current flowing from the first semiconductor layer to the third semiconductor layer may be amplified.

In another aspect, a thermoelectric component may be operatively installed to the third semiconductor layer a thermoelectric component to convert thermal energy received from the third semiconductor layer into recovered electrical current.

In another aspect, the bias current may include the recovered electrical current.

According to an embodiment of this disclosure, a method is provided for generating electricity using an improved solar electricity generation system comprising semiconductor layers to convert photons from light into electrical current. The method may include (a) generating the electrical current via a first depletion zone located between a first semiconductor layer and a second semiconductor layer that upon receiving at least part of the photons generates the electrical current in a first current direction. The method may include (b) generating the electrical current via a second depletion zone located between the second semiconductor layer and a third semiconductor layer that upon receiving at least part of the photons generates the electrical current in a second current direction. The method may include (c) generating recovered electrical current from thermal energy received from the semiconductor layers via a thermoelectric component operatively installed to the semiconductor layers.

In another aspect, the semiconductor layers may alternate between a P-type material and an N-type material. The first semiconductor layer may include the P-type material. The second semiconductor layer may include the N-type material. The third semiconductor layer may include the P-type material.

In another aspect, the semiconductor layers may be configured as a transistor configured as an amplifier circuit including an emitter provided by the first semiconductor layer, a base provided by the second semiconductor layer, and a collector provided by the third semiconductor layer. Upon the second semiconductor layer receiving a bias current, the electrical current flowing from the first semiconductor layer to the third semiconductor layer may be amplified.

In another aspect, the method may further include (d) applying the recovered electrical current to the second semiconductor layer as the bias current.

In another aspect, the semiconductor layers may be arranged to include a first angular-oriented portion to receive the photons from a first light angle of incidence and a second angular-oriented portion to receive the photons from a second light angle of incidence.

Terms and expressions used throughout this disclosure are to be interpreted broadly. Terms are intended to be understood respective to the definitions provided by this specification. Technical dictionaries and common meanings understood within the applicable art are intended to supplement these definitions. In instances where no suitable definition can be determined from the specification or technical dictionaries, such terms should be understood according to their plain and common meaning. However, any definitions provided by the specification will govern above all other sources.

Various objects, features, aspects, and advantages described by this disclosure will become more apparent from the following detailed description, along with the accompanying drawings in which like numerals represent like components.

DETAILED DESCRIPTION

Figure 1:
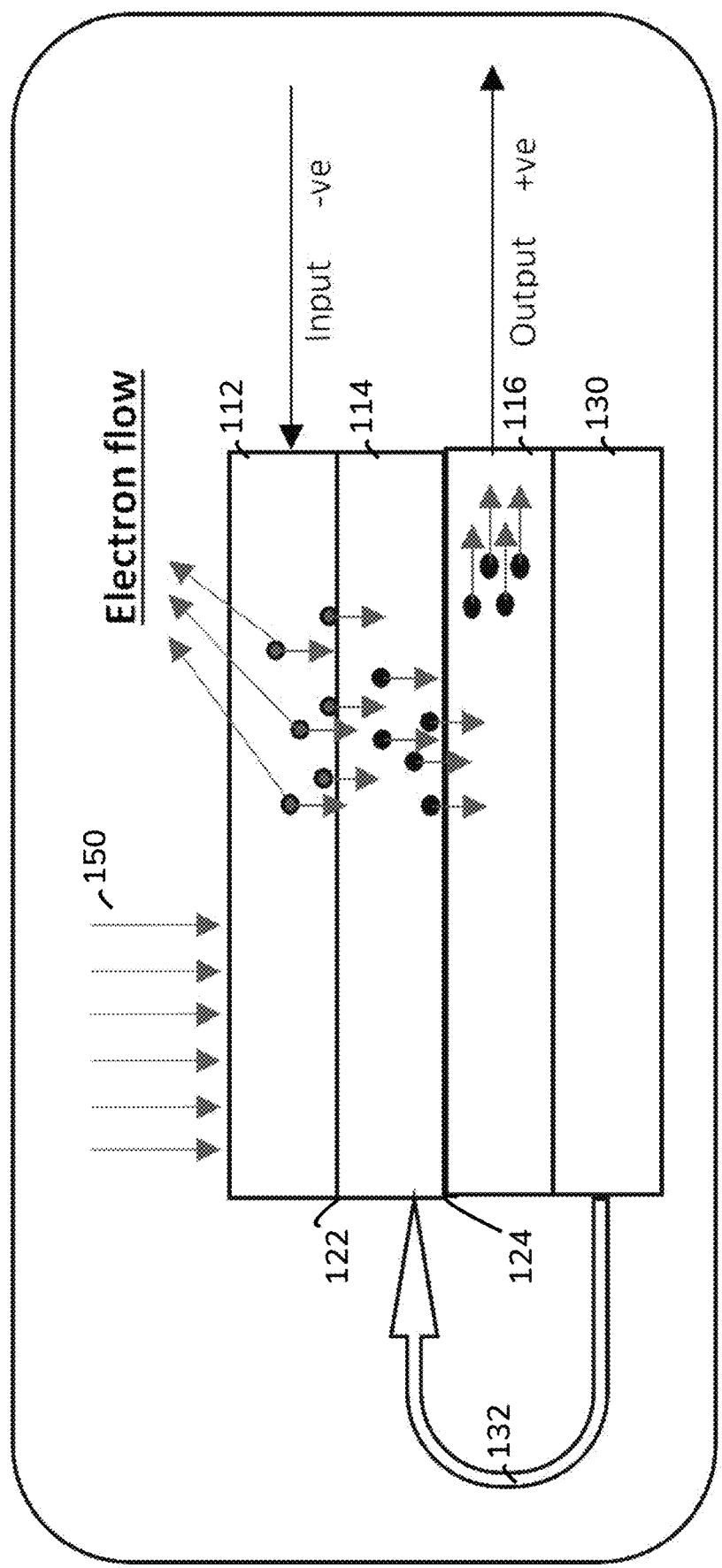
FIG. 1 is a block diagram view of an illustrative solar electricity generation system, according to an embodiment of this disclosure.

The following disclosure is provided to describe various embodiments of a solar electricity generation system. Skilled artisans will appreciate additional embodiments and uses of the present invention that extend beyond the examples of this disclosure. Terms included by any claim are to be interpreted as defined within this disclosure. Singular forms should be read to contemplate and disclose plural alternatives. Similarly, plural forms should be read to contemplate and disclose singular alternatives. Conjunctions should be read as inclusive except as stated otherwise.

Expressions such as "at least one of A, B, and C" should be read to permit any of A, B, or C singularly or in combination with the remaining elements. Additionally, such groups may include multiple instances of one or more element in that group, which may be included with other elements of the group. All numbers, measurements, and values are given as approximations unless expressly stated otherwise.

For the purpose of clearly describing the components and features discussed throughout this disclosure, some frequently used terms will now be defined, without limitation. The term photon, as it is used throughout this disclosure, is defined as a particle representing a quantum of light or other electromagnetic radiation. The term electrical current, as it is used throughout this disclosure, is defined as a flow of electric charge in a circuit. The term thermal energy, as it is used throughout this disclosure, is defined as energy produced when a difference in temperature causes molecules to move at an affected rate.

The term semiconductor, as it is used throughout this disclosure, is defined as a material that selectively conducts electricity, such as may be used in transistors, diodes, solar panels, amplifiers, and other electronic components. The term P-type material, as it is used throughout this disclosure, is defined as a semiconductor material having a larger concentration of holes compared to electrons. The term N-type material, as it is used throughout this disclosure, is defined as a semiconductor material having a larger concentration of electrons compared to holes.

The term transistor, as it is used throughout this disclosure, is defined as a semiconductor device to amplify or switch electronic signals and electrical power. The term amplifier, as it is used throughout this disclosure, is defined as an electronic device that can increase the strength of a signal, for example, voltage applied across the emitter and collector of a transistor. The term thermoelectric component, as it is used throughout this disclosure, is defined as a device that creates a voltage from a temperature differential. The term angle of incidence, as it is used throughout this disclosure, is defined as an angle between a ray, such as a light ray, and a line perpendicular to a surface on which the ray encounters.

Various aspects of the present disclosure will now be described in detail, without limitation. In the following disclosure, a solar electricity generation system will be discussed. Those of skill in the art will appreciate alternative labeling of the solar electricity generation system as a solar system, active solar electricity generation system, active solar panel, the invention, or other similar names. Similarly, those of skill in the art will appreciate alternative labeling of the solar electricity generation system as an active solar electricity generation method, method for improved solar electricity generation, solar electrical power generation method using amplification, method, operation, the invention, or other similar names. Skilled readers should not view the inclusion of any alternative labels as limiting in any way.

Referring now to FIGS. 1-5, the solar electricity generation system will now be discussed in more detail. The solar electricity generation system may include semiconductor layers 112, 114, 116, thermoelectric component 130, angular configuration 160, 162, monitoring component, and additional components that will be discussed in greater detail below. The solar electricity generation system may operate one or more of these components interactively with other components for generating electrical power from an improved solar system.

Generally, a solar electricity generation system enabled by this disclosure may advantageously be provided as a multi-layer and/or multi-junction system with diffraction grating to increase the effective surface area from which photons may be received over standard photovoltaic panels in the current state of the art. Semiconductor materials may be layered in a configuration to allow the electrical benefits of a controlled amplifier circuit to pass the electrons generated in one semiconductor layer to another semiconductor layer using a bias current applied to the middle semiconductor layer.

In some configurations, higher efficiency can be realized such that may produce about double the electrical output compared to older designs with the same size of the array. For example, increased transmission of photons into the semiconductor layers may approximately be doubled for an effective area of the cell surface. Additionally, the transmission of electrons inside the semiconductor layers may be quantifiably more efficient via addition of a thermoelectric component 130 that may convert at least part of excess thermal energy into recovered electrical current. This recovered electrical current may, in turn, be applied as a bias current to control and increase the transmission of energy via an amplifier circuit.

Figure 2:
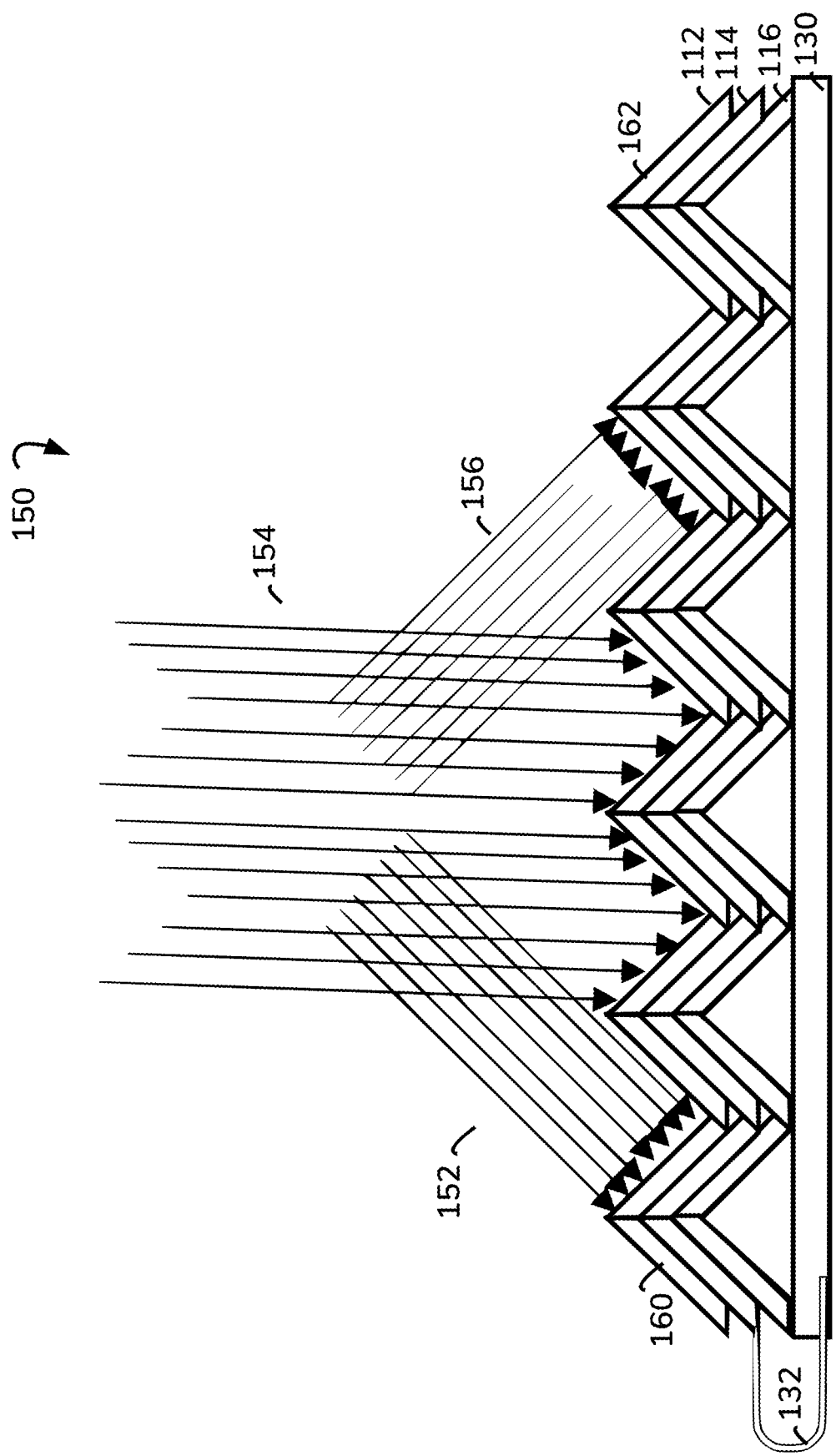
FIG. 2 is a side elevation view of an illustrative solar electricity generation system, according to an embodiment of this disclosure.
Figure 3:
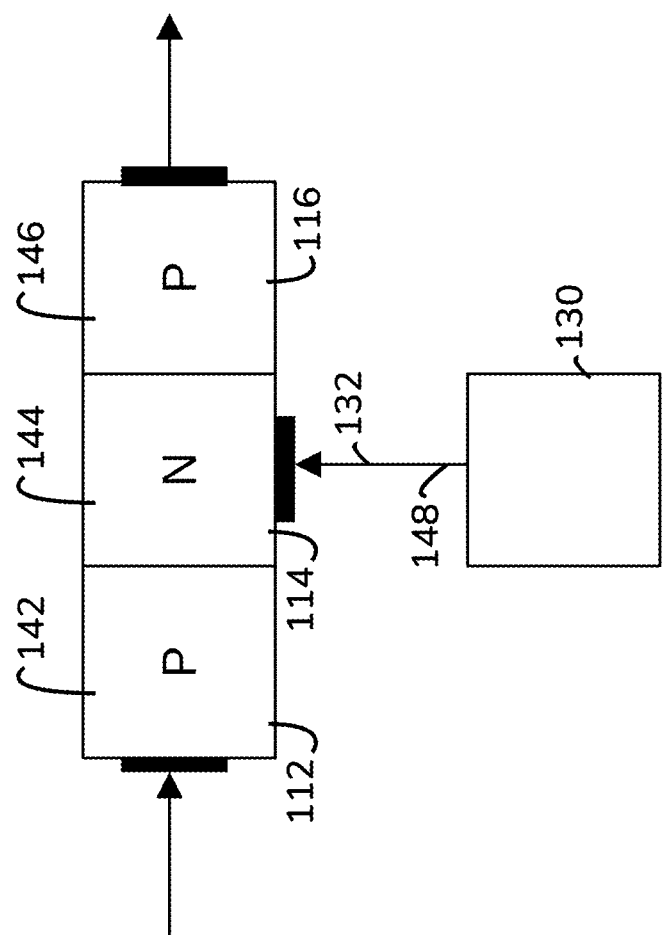
FIG. 3 is a circuit schematic view of an illustrative solar electricity generation system configured as a transistor-based amplifier, according to an embodiment of this disclosure.

The semiconductor layers will now be discussed in greater detail. FIGS. 1-3 highlight examples of the semiconductor layers, which may also be shown in other figures. An arrangement of semiconductor layers may be provided by a system enabled by this disclosure to generate electrical power with the assistance of photons in a photovoltaic operation.

In one embodiment, an array of semiconductor layers may be provided to facilitate the separation of electrons from atoms included in a depletion zone and creation of holes corresponding to the separated electrons. The electrons and holes may be used to create electrical power from a photovoltaic and/or other solar electrical power generation system. Examples will be provided throughout this disclosure having three semiconductor layers. However, those having skill in the art will appreciate that additional configurations and examples may be enabled by this disclosure and the use of the three-layer examples below is not intended to limit this disclosure in any way.

The semiconductor layers may include three layers of semiconductor material configured in an arrangement of P-type materials and N-type materials. For example, the semiconductor layers may include a first semiconductor layer 112, a second semiconductor layer 114, and a third semiconductor layer 116. Depletion zones may be included between the semiconductor layers, as will be appreciated by those of skill in the art. For example, a first depletion zone 122 may be located between a first semiconductor layer and a second semiconductor layer. In another example, a second depletion zone 124 may be located between the second semiconductor layer and a third semiconductor layer.

As light is received by the semiconductor layers, photons from the light may interact with atoms in the depletion zones to separate electrons from the corresponding atom. This process may create electrons and holes. As will be appreciated by those of skill in the art, holes may represent positive charges provided by atoms that may accept electrons. Once separated, the electrons and holes may become attracted to the corresponding semiconductor layers, such as for example having P-type materials and/or N-type materials. In one example, the flow of electrons in a first depletion zone 122 may flow in a first current direction and the flow of electrons in a second depletion zone 124 may flow in a second current direction. The first current direction and the second current direction may be opposite of one another, without limitation.

By including more than a single depletion zone, this disclosure advantageously provides an improvement over typical P-N junction solar cells common to the current state of the art. A system enabled by this disclosure advantageously provides an increased opportunity to use the energy from photons interacting with the depletion zones to separate holes in electrons, and thus the amount of electrical current capable of being generated may be increased.

The semiconductor layers may be constructed using a variety of semiconductor materials. As will be appreciated by those of skill in the art, a semiconductor is a material that selectively conducts electricity respective to a condition present for that semiconductor material. Semiconductors may arrange materials used in solar panels in monocrystalline, polycrystalline, and/or other organizational structures.

Monocrystalline semiconductor materials may be constructed using semiconductor cells in a homogeneous arrangement and/or orientation. Additionally, semiconductor materials may be included in polycrystalline configurations, which may include semiconductor segments in varying orientations operatively connected to one another. As will be appreciated by those of skill in the art, monocrystalline solar panels may provide an increased efficiency over their polycrystalline solar panel alternatives, but such increased efficiency may come at the expense of increased manufacturing cost.

Another type of solar panel cells that may be used with a system enabled by this disclosure include amorphous solar panels, which may differ from monocrystalline and polycrystalline semiconductor configurations by applying a semiconductor material over a thin, flexible layer that may be deformed and/or molded to a desired application.

As will be appreciated by those of skill in the art, a variety of semiconductor materials may be selected for the manufacture and installation of semiconductor layers for a system enabled by this disclosure. Illustrative materials may include semiconductors formed from crystalline inorganic solids, such as silicon, gallium arsenide, germanium, silicon carbide, gallium nitride, gallium phosphate, cadmium sulfide, lead sulfide, and/or other semiconductor materials that would be apparent to a person of skill in the art after having the benefit of this disclosure.

The semiconductor materials may be at least partially doped to provide positive and/or negative charge characteristics. For example, a semiconductor material may be doped to be used as the semiconductor layers having P-type materials, N-type materials, and other configurations that would be appreciated by those of skill in the art after having the benefit of this disclosure.

Multiple semiconductor layers may be arranged in an alternating pattern of P-type and N-type materials. For example, three semiconductor layers may be arranged in a PNP configuration, as will be appreciated by those of skill in the art. However, skilled artisans will appreciate additional applications in which NPN configurations may be used, without limitation. Examples given throughout this disclosure as PNP configurations are not intended to limit the scope of this invention except as were expressly stated otherwise.

In one embodiment, the first semiconductor layer 112 may be constructed using P-type materials, which may advantageously attract holes from the depletion layer upon interaction from a photon modifying atoms into their constituent holes and electrons. The second semiconductor layer 114 may include an N-type material, which may attract one or more electrons upon the interactions from the photon modifying atoms into the constituent holes and electrons. A third semiconductor layer 116 may be provided using P-type materials, which may similarly attract holes such as described above with the first semiconductor layer 112.

In one embodiment, the first semiconductor layer 112 may be oriented at the top of a solar electricity generation system such as one enabled by this disclosure, such that it may receive the most direct sunlight during operation. In this embodiment, the second semiconductor layer 114 may be positioned in the middle orientation, with the third semiconductor layer 116 being positioned near the bottom of the structure.

Additional components, such as a thermoelectric component 130, may be operatively attached to the third semiconductor layer 116 at the bottom of the system enabled by this disclosure. In an alternative configuration, the third semiconductor layer 116 may be oriented at the top such to receive the most direct sunlight, having the second semiconductor layer 114 being oriented in the middle, and the first semiconductor layer 112 being positioned at the bottom, which may interface with an additional component such as a thermoelectric component 130, without limitation.

By providing multiple depletion zones from which photons may separate holes and electrons from the atoms included within the depletion zone, the total amount of electrical current that may be generated by a solar electricity generation system enabled by this disclosure may advantageously be increased. Additionally, features may be provided to further increase the amount of electricity that may be generated by such a system.

In one embodiment, the semiconductor layers may be configured in an arrangement such as to provide the functionality of a transistor. For example, the semiconductor layers may be configured as a double junction transistor. In an arrangement as a transistor, the transistor may be configured to operate as an amplifier circuit. As will be appreciated by those of skill in the art, an amplifier circuit may increase the voltage of an electrical current passing through the circuit as affected by a bias current applied to the base of the transistor operating as the amplifier.

For example, the first semiconductor layer 112 may be provided as an emitter 142 of an amplifier circuit, the second semiconductor layer 114 may be provided as a base 144 of an amplifier circuit, and a third semiconductor layer 116 may be provided as a collector 146 of an amplifier circuit. The properties of electrical current flowing from the emitter 142 to the collector 146 of such an amplifier circuit may be affected by a bias current 148 applied to the base 144 of the amplifier circuit. Those having skill in the art will appreciate alternative configurations for amplifier circuits using PNP and/or NPN configurations, as will be appreciated after having the benefit of this disclosure.

The thermoelectric component will now be discussed in greater detail. FIGS. 1-3 highlight examples of the thermoelectric component, which may also be shown in other figures. As mentioned above, a thermoelectric component 130 may be included by a solar power generation system, such as enabled by this disclosure. The thermoelectric component 130 may advantageously convert thermal energy into electrical energy. For example, the thermoelectric component 130 may use the Peltier effect to at least partially convert thermal energy into electrical energy. In another example, the thermoelectric component 130 may include a Peltier chip to perform the thermal-to-electrical conversion operation. As will be appreciated by those of skill in the art, operation of a Peltier chip may be performed when a temperature gradient exists between different sides of the Peltier structure. This gradient is converted into electrical current which may be used to drive various electrical devices.

Thermal energy may be provided to the thermoelectric component 130 via operation of the semiconductor layers operatively connected to the thermoelectric component 130. For example, generation of electrical power may create heat from resistances inherent to the structure of the semiconductor layers, solar panels, and other electronics and components that may affect the operational characteristics of a system enabled by this disclosure. Additionally, as infrared energy from the sun is received by solar panels and the corresponding semiconductor layers provided by the solar panels, such infrared energy may be converted into heat.

In solar systems known in the current state of the art, such heat is considered waste and must be dissipated using heat sinks, liquid cooling, and other complex cooling systems. By including a thermoelectric component 130 operatively attached to the semiconductor layers, at least part of this heat may be converted into recovered electrical current 132, which may be output with the electrical power generated by the semiconductor layers and/or otherwise used to increase the efficiency of a system enabled by this disclosure.

In one embodiment, the recovered electrical current 132 created by the thermoelectric component 130 may be delivered to the second semiconductor layer 114 to affect the characteristics of an amplifier circuit. For example, at least part of the recovered electrical current 132 may be applied as a bias current 148 to the second semiconductor layer 114 operating as the base 144 of a transistor. This bias current 148 may drive the amplifier characteristics of the transistor in the amplifier circuit, as may be provided by the alternating semiconductor layers included by a solar power generation system enabled by this disclosure.

The angular configuration will now be discussed in greater detail. FIGS. 1-3 highlight examples of the angular configuration, which may also be shown in other figures. In one embodiment, the semiconductor layers may be configured in varying angles, approaches, slopes, slants, and other variations that would be appreciated by a person of skill in the art after having the benefit of this disclosure.

An example will now be discussed for a semiconductor layer having two angular-oriented positions without limitation. Those of skill in the art will appreciate that additional embodiments are intended to be included within the scope and spirit of this disclosure that may include additional angular-oriented positions, which may provide further benefits to the amount of solar energy that may be captured during operation of a system enabled by this disclosure.

In an example in which two angular-oriented positions are provided for configuration of the semiconductor layers, at least part of the surface area of the semiconductor layers may be oriented such to provide an increased surface area from which light may be received. This increased collective surface may thus increase a number of photons that may be used to create electrons and holes in the depletion zones, which may thus increase the efficiency of electrical power generation.

By including multiple angular positions, a system enabled by the disclosure may advantageously increase the likelihood that the solar panels are positioned to receive light most directly from a source such as the sun. Additionally, by including multiple angular positions, at least part of the light that would normally be reflected away from the surface of a solar panel may instead be reflected to another surface of a solar panel having a different angular orientation. The reflected light may then be captured by the second solar panel section to contribute to electrical power generation, thereby further increasing the efficiency of a solar electric power generation system such as one enabled by this disclosure.

In one example including two angular orientations for the semiconductor layers, provided without limitation, a first angular-oriented position 160 may be provided to receive photons from a first light angle of incidence 156. Additionally, a second angular-oriented position 162 may be provided to receive photons from a second light angle of incidence 156. In this example, provided without limitation, the first angular-oriented position 160 may be angled such as to receive light 156 from the sun as rays of light from the sun may be received during a first half of a day. Additionally, the second angular-oriented 162 position may be angled such as to receive light 152 from the sun as rays of light may be received during the second half of the day. Additionally, during the middle portion of the day in which rays of light 154 may approximately shine directly upon the surface of the Earth, at least part of the light may be reflected from an angular surface of the first angular-oriented portion 160 and/or the second angular-oriented portion 162 such as may be received from the corresponding second angular-oriented portion 162 and/or first angular-oriented portion 160, respectively. In one embodiment, the semiconductor layers may alternate between the first angular-oriented positions and the second angular-oriented positions, which may create an approximately sawtooth shape, without limitation.

In one embodiment, each of the semiconductor layers may be configured to include the angular orientation. In this embodiment, the bottom semiconductor layer may be operatively connected to the thermoelectric component 130. For example, the thermoelectric component 130 may be shaped such as to receive the angular configuration of the semiconductor layers. In another example, an interface layer may be provided to allow transmission of thermal energy from the bottom layer of the semiconductor layers to the thermoelectric component 130, without limitation.

The monitoring component will now be discussed in greater detail. In one embodiment, a monitoring component may be provided to monitor operation of a system enabled by this disclosure and/or control operation of the system. An illustrative monitoring system may include an operational sensor to detect a condition relating to operation of the solar electricity generation system. An illustrative monitoring system may additionally include a geolocation sensor to approximate an installation location. A communication module may be included to communicate data between the monitoring component and an external device. Conditions may be remotely monitored via the monitoring component.

In one embodiment, the operational sensors may assist with detecting the conditions relating to operation of a solar electricity generation system such as when enabled by this disclosure. For example, the operational sensors may determine the power generation of such a system, detect temperatures, determine effective hours of operation, and/or detect other operational parameters that would be appreciated by a person of skill in the art after having the benefit of this disclosure.

The monitoring component may include a geolocation sensor, which may assist with determining an approximate installation location. The geolocation information may be used to approximate and/or identify a particular solar panel and associate that identification with the data and other information received from the operational sensors. Such combined information may be used to have higher resolution as to the operational parameters and conditions of such a system enabled by this disclosure.

The monitoring component may additionally include a communication module to facilitate communication of data between the monitoring component and an external device. In one example, an external device may include a server, software as a service (SaaS), smartphone, installable application, and/or other interface that would be appreciated by a person of skill in the art after having the benefit of this disclosure. In some embodiments, an operator may remotely change and control operation of a system enabled by this disclosure via the communications component and as applied by the monitoring component.

Figure 4:
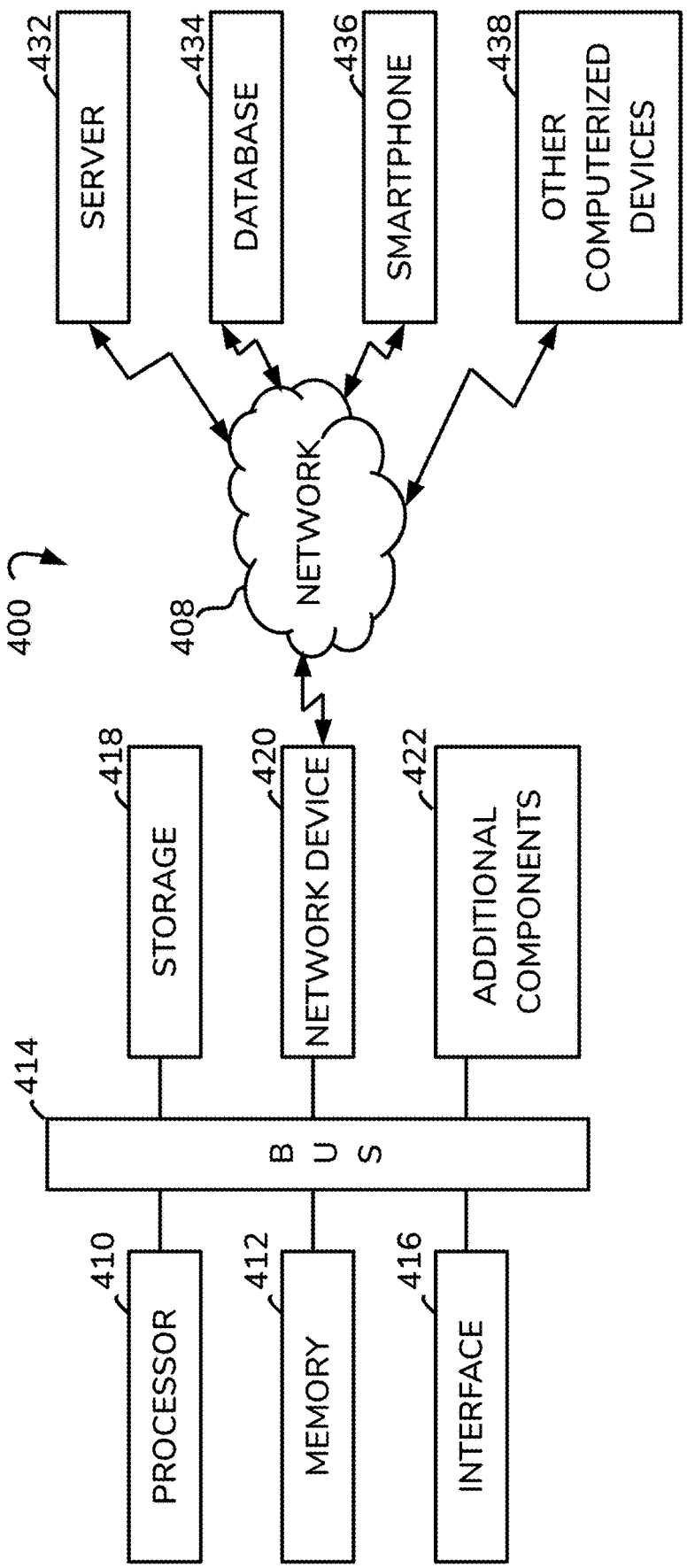
FIG. 4 is a block diagram view of an illustrative computerized device upon which computer instructions may be operated, according to an embodiment of this disclosure.

Referring now to FIG. 4, an illustrative computerized device will be discussed, without limitation. Various aspects and functions described in accord with the present disclosure may be implemented as hardware or software on one or more illustrative computerized devices 400 or other computerized devices. There are many examples of illustrative computerized devices 400 currently in use that may be suitable for implementing various aspects of the present disclosure. Some examples include, among others, network appliances, personal computers, workstations, mainframes, networked clients, servers, media servers, application servers, database servers and web servers. Other examples of illustrative computerized devices 400 may include mobile computing devices, cellular phones, smartphones, tablets, video game devices, personal digital assistants, network equipment, devices involved in commerce such as point of sale equipment and systems, such as handheld scanners, magnetic stripe readers, bar code scanners and their associated illustrative computerized device 400, among others. Additionally, aspects in accord with the present disclosure may be located on a single illustrative computerized device 400 or may be distributed among one or more illustrative computerized devices 400 connected to one or more communication networks.

For example, various aspects and functions may be distributed among one or more illustrative computerized devices 400 configured to provide a service to one or more client computers, or to perform an overall task as part of a distributed system. Additionally, aspects may be performed on a client-server or multi-tier system that includes components distributed among one or more server systems that perform various functions. Thus, the disclosure is not limited to executing on any particular system or group of systems. Further, aspects may be implemented in software, hardware or firmware, or any combination thereof. Thus, aspects in accord with the present disclosure may be implemented within methods, acts, systems, system elements and components using a variety of hardware and software configurations, and the disclosure is not limited to any particular distributed architecture, network, or communication protocol.

FIG. 4 shows a block diagram of an illustrative computerized device 400, in which various aspects and functions in accord with the present disclosure may be practiced. The illustrative computerized device 400 may include one or more illustrative computerized devices 400. The illustrative computerized devices 400 included by the illustrative computerized device may be interconnected by, and may exchange data through, a communication network 408. Data may be communicated via the illustrative computerized device using a wireless and/or wired network connection.

Network 408 may include any communication network through which illustrative computerized devices 400 may exchange data. To exchange data via network 408, systems and/or components of the illustrative computerized device 400 and the network 408 may use various methods, protocols and standards including, among others, Ethernet, Wi-Fi, Bluetooth, TCP/IP, UDP, HTTP, FTP, SNMP, SMS, MMS, SS7, JSON, XML, REST, SOAP, RMI, DCOM, and/or Web Services, without limitation. To ensure data transfer is secure, the systems and/or modules of the illustrative computerized device 400 may transmit data via the network 408 using a variety of security measures including TSL, SSL, or VPN, among other security techniques. The illustrative computerized device 400 may include any number of illustrative computerized devices 400 and/or components, which may be networked using virtually any medium and communication protocol or combination of protocols.

Various aspects and functions in accord with the present disclosure may be implemented as specialized hardware or software executing in one or more illustrative computerized devices 400, including an illustrative computerized device 400 shown in FIG. 4. As depicted, the illustrative computerized device 400 may include a processor 410, memory 412, a bus 414 or other internal communication system, an input/output (I/O) interface 416, a storage system 418, and/or a network communication device 420. Additional devices 422 may be selectively connected to the computerized device via the bus 414. Processor 410, which may include one or more microprocessors or other types of controllers, can perform a series of instructions that result in manipulated data. Processor 410 may be a commercially available processor such as an ARM, x86, Intel Core, Intel Pentium, Motorola PowerPC, SGI MIPS, Sun UltraSPARC, or Hewlett-Packard PA-RISC processor, but may be any type of processor or controller as many other processors and controllers are available. As shown, processor 410 may be connected to other system elements, including a memory 412, by bus 414.

The illustrative computerized device 400 may also include a network communication device 420. The network communication device 420 may receive data from other components of the computerized device to be communicated with servers 432, databases 434, smart phones 436, and/or other computerized devices 438 via a network 408. The communication of data may optionally be performed wirelessly. More specifically, without limitation, the network communication device 420 may communicate and relay information from one or more components of the illustrative computerized device 400, or other devices and/or components connected to the computerized device 400, to additional connected devices 432, 434, 436, and/or 438. Connected devices are intended to include, without limitation, data servers, additional computerized devices, mobile computing devices, smart phones, tablet computers, and other electronic devices that may communicate digitally with another device. In one example, the illustrative computerized device 400 may be used as a server to analyze and communicate data between connected devices.

The illustrative computerized device 400 may communicate with one or more connected devices via a communications network 408. The computerized device 400 may communicate over the network 408 by using its network communication device 420. More specifically, the network communication device 420 of the computerized device 400 may communicate with the network communication devices or network controllers of the connected devices. The network 408 may be, for example, the internet. As another example, the network 408 may be a WLAN. However, skilled artisans will appreciate additional networks to be included within the scope of this disclosure, such as intranets, local area networks, wide area networks, peer-to-peer networks, and various other network formats. Additionally, the illustrative computerized device 400 and/or connected devices 432, 434, 436, and/or 438 may communicate over the network 408 via a wired, wireless, or other connection, without limitation.

Memory 412 may be used for storing programs and/or data during operation of the illustrative computerized device 400. Thus, memory 412 may be a relatively high performance, volatile, random access memory such as a dynamic random-access memory (DRAM) or static memory (SRAM). However, memory 412 may include any device for storing data, such as a disk drive or other non-volatile storage device. Various embodiments in accord with the present disclosure can organize memory 412 into particularized and, in some cases, unique structures to perform the aspects and functions of this disclosure.

Components of illustrative computerized device 400 may be coupled by an interconnection element such as bus 414. Bus 414 may include one or more physical busses (for example, busses between components that are integrated within a same machine) but may include any communication coupling between system elements including specialized or standard computing bus technologies such as USB, Thunderbolt, SATA, FireWire, IDE, SCSI, PCI, and InfiniBand. Thus, bus 414 may enable communications (for example, data and instructions) to be exchanged between system components of the illustrative computerized device 400.

The illustrative computerized device 400 also may include one or more interface devices 416 such as input devices, output devices and combination input/output devices. Interface devices 416 may receive input or provide output. More particularly, output devices may render information for external presentation. Input devices may accept information from external sources. Examples of interface devices include, among others, keyboards, bar code scanners, mouse devices, trackballs, magnetic strip readers, microphones, touch screens, printing devices, display screens, speakers, network interface cards, etc. The interface devices 416 allow the illustrative computerized device 400 to exchange information and communicate with external entities, such as users and other systems.

Storage system 418 may include a computer readable and writeable nonvolatile storage medium in which instructions can be stored that define a program to be executed by the processor. Storage system 418 also may include information that is recorded, on or in, the medium, and this information may be processed by the program. More specifically, the information may be stored in one or more data structures specifically configured to conserve storage space or increase data exchange performance. The instructions may be persistently stored as encoded bits or signals, and the instructions may cause a processor to perform any of the functions described by the encoded bits or signals. The medium may, for example, be optical disk, magnetic disk, or flash memory, among others. In operation, processor 410 or some other controller may cause data to be read from the nonvolatile recording medium into another memory, such as the memory 412, that allows for faster access to the information by the processor than does the storage medium included in the storage system 418. The memory may be located in storage system 418 or in memory 412. Processor 410 may manipulate the data within memory 412, and then copy the data to the medium associated with the storage system 418 after processing is completed. A variety of components may manage data movement between the medium and integrated circuit memory element and does not limit the disclosure. Further, the disclosure is not limited to a particular memory system or storage system.

Although the above-described illustrative computerized device is shown by way of example as one type of illustrative computerized device upon which various aspects and functions in accord with the present disclosure may be practiced, aspects of the disclosure are not limited to being implemented on the illustrative computerized device 400 as shown in FIG. 4. Various aspects and functions in accord with the present disclosure may be practiced on one or more computers having components other than that shown in FIG. 4. For instance, the illustrative computerized device 400 may include specially programmed, special-purpose hardware, such as for example, an application-specific integrated circuit (ASIC) tailored to perform a particular operation disclosed in this example. While another embodiment may perform essentially the same function using several general-purpose computing devices running Windows, Linux, Unix, Android, iOS, MAC OS X, or other operating systems on the aforementioned processors and/or specialized computing devices running proprietary hardware and operating systems.

The illustrative computerized device 400 may include an operating system that manages at least a portion of the hardware elements included in illustrative computerized device 400. A processor or controller, such as processor 410, may execute an operating system which may be, among others, an operating system, one of the above-mentioned operating systems, one of many Linux-based operating system distributions, a UNIX operating system, or another operating system that would be apparent to skilled artisans. Many other operating systems may be used, and embodiments are not limited to any particular operating system.

The processor and operating system may work together to define a computing platform for which application programs in high-level programming languages may be written. These component applications may be executable, intermediate (for example, C # or JAVA bytecode) or interpreted code which communicate over a communication network (for example, the Internet) using a communication protocol (for example, TCP/IP). Similarly, aspects in accord with the present disclosure may be implemented using an object-oriented programming language, such as JAVA, C, C++, C #, Python, PHP, Visual Basic.NET, JavaScript, Perl, Ruby, Delphi/Object Pascal, Visual Basic, Objective-C, Swift, MATLAB, PL/SQL, OpenEdge ABL, R, Fortran or other languages that would be apparent to skilled artisans. Other object-oriented programming languages may also be used. Alternatively, assembly, procedural, scripting, or logical programming languages may be used.

Additionally, various aspects and functions in accord with the present disclosure may be implemented in a non-programmed environment (for example, documents created in HTML5, HTML, XML, CSS, JavaScript, or other format that, when viewed in a window of a browser program, render aspects of a graphical-user interface, or perform other functions). Further, various embodiments in accord with the present disclosure may be implemented as programmed or non-programmed elements, or any combination thereof. For example, a web page may be implemented using HTML while a data object called from within the web page may be written in C++. Thus, the disclosure is not limited to a specific programming language and any suitable programming language could also be used.

An illustrative computerized device included within an embodiment may perform functions outside the scope of the disclosure. For instance, aspects of the system may be implemented using an existing commercial product, such as, for example, Database Management Systems such as a SQL Server available from Microsoft of Redmond, Wash., Oracle Database or MySQL from Oracle of Austin, Tex., or integration software such as WebSphere middleware from IBM of Armonk, N.Y.

In operation, a method may be provided for generating electrical current from an improved solar system. Those of skill in the art will appreciate that the following methods are provided to illustrate an embodiment of the disclosure and should not be viewed as limiting the disclosure to only those methods or aspects. Skilled artisans will appreciate additional methods within the scope and spirit of the disclosure for performing the operations provided by the examples below after having the benefit of this disclosure. Such additional methods are intended to be included by this disclosure.

According to an embodiment of this disclosure, a method is provided for generating electricity using an improved solar electricity generation system comprising semiconductor layers to convert photons from light into electrical current. The method may include (a) generating the electrical current via a first depletion zone located between a first semiconductor layer and a second semiconductor layer that upon receiving at least part of the photons generates the electrical current in a first current direction. The method may include (b) generating the electrical current via a second depletion zone located between the second semiconductor layer and a third semiconductor layer that upon receiving at least part of the photons generates the electrical current in a second current direction. The method may include (c) generating recovered electrical current from thermal energy received from the semiconductor layers via a thermoelectric component operatively installed to the semiconductor layers.

In one embodiment, the semiconductor layers may alternate between a P-type material and an N-type material. The first semiconductor layer may include the P-type material. The second semiconductor layer may include the N-type material. The third semiconductor layer may include the P-type material. Semiconductor layers may be configured as a transistor configured as an amplifier circuit including an emitter provided by the first semiconductor layer, a base provided by the second semiconductor layer, and a collector provided by the third semiconductor layer. Upon the second semiconductor layer receiving a bias current, the electrical current flowing from the first semiconductor layer to the third semiconductor layer may be amplified.

In one embodiment, the method may further include (d) applying the recovered electrical current to the second semiconductor layer as the bias current. The semiconductor layers may be arranged to include a first angular-oriented portion to receive the photons from a first light angle of incidence and a second angular-oriented portion to receive the photons from a second light angle of incidence.

Figure 5:
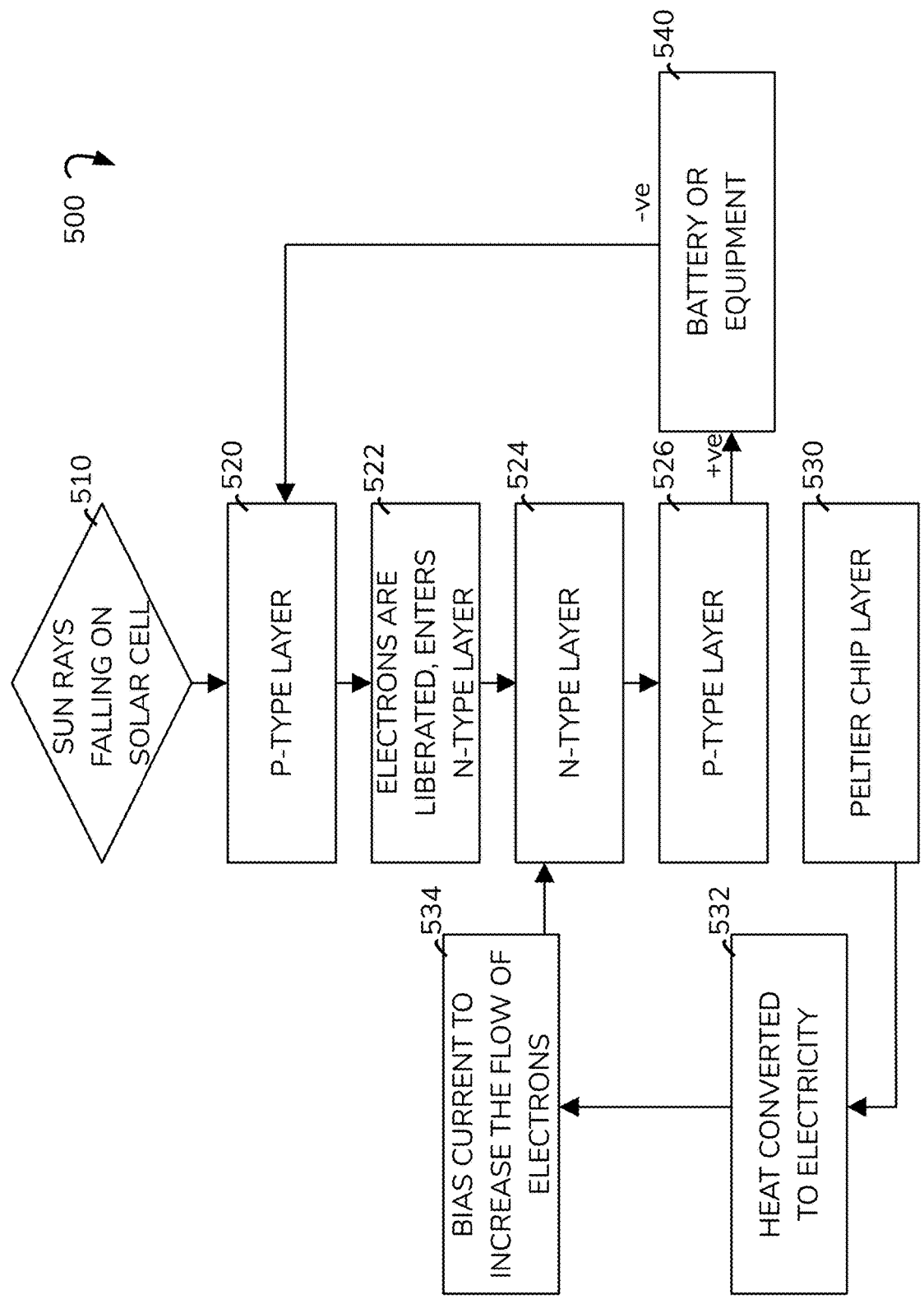
FIG. 5 is a flow chart view of an illustrative electricity generation method, according to an embodiment of this disclosure.

Referring now to flowchart 500 of FIG. 5, an example for an illustrative electricity generation method will be described, without limitation. The operation may begin by capturing solar energy from sun rays falling on a semiconductor layer of a solar cell. (Block 510). As discussed throughout this disclosure, one or more of the solar cells may include an angular orientation to facilitate capturing additional sun rays into light energy. The light energy, including the photons inherent to the light energy, may then be received by the first semiconductor layer. (Block 520). In this example, the first semiconductor layer is a P-type layer. In an embodiment that includes an angular orientation to the semiconductor layers, an increased number of photons may be received by the P-type layer in the operation included by Block 520. The photons may then pass to the depletion zone between the first semiconductor layer and the second semiconductor layer.

Electrons may be liberated by interactions with the photons in the depletion zone between the first semiconductor layer in the second semiconductor layer. (Block 522). Liberated electrons may migrate from the first depletion zone to the second semiconductor layer, which may include N-type material. (Block 524). As will be discussed below, the second semiconductor layer may receive a base voltage to affect the behavior of the semiconductor layers. Additional photons may interact with atoms in the second depletion zone located between the second semiconductor layer and the third semiconductor layer. The third semiconductor layer may be a P-type layer and may collect an increased flow of electrons and supply such electrons to an output terminal. (Block 526).

The electron supplied to the output terminal may be used to power a load, charge a battery, operate equipment, or otherwise be used as will be appreciated by a person of skill in the art after having the benefit of this disclosure. (Block 540). After the electrons are used and/or stored, electrons may follow a return path to the first semiconductor layer, which may be constructed using a P-type material, as depicted by Block 520.

Heat generated in the photovoltaic process may be radiated from the first semiconductor layer, second semiconductor layer, third semiconductor layer, and/or other aspects of the semiconductor layers to the thermoelectric component located below the final semiconductor layer. (Block 530). The thermoelectric component may then convert at least part of the thermal energy into electrical energy, for example, a DC voltage. (Block 532). The electrical energy may then be supplied to the second semiconductor layer as a bias current, which may be an N-type layer, to boost the flow of electrons through the second semiconductor layer as may be provided by an amplifier circuit. (Block 534). This process may continue as long as solar energy continues to be provided to the semiconductor layers.

While various aspects have been described in the above disclosure, the description of this disclosure is intended to illustrate and not limit the scope of the invention. The invention is defined by the scope of the appended claims and not the illustrations and examples provided in the above disclosure. Skilled artisans will appreciate additional aspects of the invention, which may be realized in alternative embodiments, after having the benefit of the above disclosure. Other aspects, advantages, embodiments, and modifications are within the scope of the following claims.

What is claimed is:

1. An improved solar electricity generation system comprising:
   semiconductor layers to convert photons from light into electrical current comprising:
   a first semiconductor layer,
   a second semiconductor layer,
   a third semiconductor layer,
   a first depletion zone located between the first semiconductor layer and the second semiconductor layer that upon receiving at least part of the photons generates the electrical current in a first current direction, and
   a second depletion zone located between the second semiconductor layer and the third semiconductor layer that upon receiving at least part of the photons generates the electrical current in a second current direction; and
   a thermoelectric component operatively installed to the semiconductor layers to convert thermal energy received from the semiconductor layers into recovered electrical current to be directed to the second semiconductor layer as a bias current.

2. The system of claim 1, wherein the semiconductor layers alternate between a P-type material and an N-type material.

3. The system of claim 2:
   wherein the first semiconductor layer comprises the P-type material;
   wherein the second semiconductor layer comprises the N-type material; and
   wherein the third semiconductor layer comprises the P-type material.

4. The system of claim 1, wherein the semiconductor layers are configured as a transistor.

5. The system of claim 4, wherein the transistor further comprises:
   an emitter provided by the first semiconductor layer,
   a base provided by the second semiconductor layer, and
   a collector provided by the third semiconductor layer;
   wherein the transistor is configured as an amplifier circuit; and
   wherein upon the second semiconductor layer receiving a bias current, the electrical current flowing from the first semiconductor layer to the third semiconductor layer is amplified.

6. The system of claim 5, wherein the bias current comprises the recovered electrical current.

7. The system of claim 4, wherein the transistor is a double junction transistor configured as an amplifier circuit.

8. The system of claim 1, wherein the thermoelectric component comprises a Peltier chip.

9. The system of claim 1:
   wherein the semiconductor layers are arranged comprising:
   a first angular-oriented portion to receive the photons from a first light angle of incidence, and
   a second angular-oriented portion to receive the photons from a second light angle of incidence.

10. The system of claim 9:
    wherein the semiconductor layers alternate between the first angular-oriented portion and the second angular-oriented portion.

11. The system of claim 1, further comprising:
a monitoring component comprising:
an operational sensor to detect a condition relating to operation of the solar electricity generation system;
a geolocation sensor to approximate an installation location;
a communication module to communicate data between the monitoring component and an external device; and
wherein the condition is remotely monitored via the monitoring component.

12. An improved solar electricity generation system comprising:
semiconductor layers alternating between a P-type material and an N-type material to convert photons from light into electrical current and selectively operate as an amplifier comprising:
a first semiconductor layer comprising the P-type material,
a second semiconductor layer comprising the N-type material to receive a bias current when operated as the amplifier,
a third semiconductor layer comprising the P-type material,
a first depletion zone located between the first semiconductor layer and the second semiconductor layer that upon receiving at least part of the photons generates the electrical current in a first current direction, and
a second depletion zone located between the second semiconductor layer and the third semiconductor layer that upon receiving at least part of the photons generates the electrical current in a second current direction; and
a thermoelectric component operatively installed to the semiconductor layers to convert thermal energy received from the semiconductor layers into recovered electrical current to be directed to the second semiconductor layer as a bias current.

13. The system of claim 12, wherein the semiconductor layers are configured as a transistor comprising:
an emitter provided by the first semiconductor layer,
a base provided by the second semiconductor layer, and
a collector provided by the third semiconductor layer;
wherein the transistor is configured as an amplifier circuit; and
wherein upon the second semiconductor layer receiving the bias current, the electrical current flowing from the first semiconductor layer to the third semiconductor layer is amplified.

14. The system of claim 12, wherein the bias current comprises the recovered electrical current.

15. An improved solar electricity generation system comprising:
semiconductor layers configured as a transistor to convert photons from light into electrical current comprising:
a first semiconductor layer provided as an emitter,
a second semiconductor layer provided as a base,
a third semiconductor layer provided as a collector,
a first depletion zone located between the first semiconductor layer and the second semiconductor layer that upon receiving at least part of the photons generates the electrical current in a first current direction, and
a second depletion zone located between the second semiconductor layer and the third semiconductor layer that upon receiving at least part of the photons generates the electrical current in a second current direction;
a thermoelectric component operatively installed to the semiconductor layers to convert thermal energy received from the semiconductor layers into recovered electrical current to be directed to the second semiconductor layer as a bias current;
wherein the transistor is configured as an amplifier circuit; and
wherein upon the second semiconductor layer receiving the recovered electrical current in the form of a bias current, the electrical current flowing from the first semiconductor layer to the third semiconductor layer is amplified.

16. The system of claim 15, wherein the transistor is a double junction transistor configured as an amplifier circuit.

17. The system of claim 15, wherein the thermoelectric component comprises a Peltier chip.

18. The system of claim 15:
wherein the semiconductor layers are arranged comprising:
a first angular-oriented portion to receive the photons from a first light angle of incidence, and
a second angular-oriented portion to receive the photons from a second light angle of incidence; and
wherein the semiconductor layers alternate between the first angular-oriented portion and the second angular-oriented portion.

* * * * *